(12) United States Patent
Renwick et al.

(10) Patent No.: US 8,300,214 B2
(45) Date of Patent: Oct. 30, 2012

(54) SYSTEM AND METHOD FOR AN ADJUSTING OPTICAL PROXIMITY EFFECT FOR AN EXPOSURE APPARATUS

(75) Inventors: Stephen P. Renwick, San Bruno, CA (US); Steven Douglas Slonaker, San Mateo, CA (US)

(73) Assignee: Nikon Precision Inc., Belmont, CA (US)

( * ) Notice: Subject to any disclaimer, the term of this patent is extended or adjusted under 35 U.S.C. 154(b) by 574 days.

(21) Appl. No.: 12/342,987

(22) Filed: Dec. 23, 2008

(65) Prior Publication Data

US 2009/0213349 A1    Aug. 27, 2009

Related U.S. Application Data

(60) Provisional application No. 61/030,934, filed on Feb. 22, 2008.

(51) Int. Cl.
*G03B 27/32* (2006.01)
(52) U.S. Cl. ........................................ 355/77
(58) Field of Classification Search .................... 355/67, 355/75, 77; 356/124
See application file for complete search history.

(56) References Cited

U.S. PATENT DOCUMENTS

| | | | |
|---|---|---|---|
| 6,846,617 B2 | 1/2005 | Pierrat | |
| 7,073,924 B2 | 7/2006 | Koizumi et al. | |
| 7,123,346 B2 | 10/2006 | Koizumi et al. | |
| 7,164,960 B2 * | 1/2007 | Komine et al. | 700/110 |
| 7,999,920 B2 * | 8/2011 | Ye et al. | 355/77 |
| 2005/0164095 A1 * | 7/2005 | Ozawa | 430/5 |
| 2006/0110837 A1 * | 5/2006 | Gupta et al. | 438/14 |

(Continued)

FOREIGN PATENT DOCUMENTS

JP    2003-318092 A    11/2003

(Continued)

OTHER PUBLICATIONS

Stephen P. Renwick et al., Pupil-fill imperfections and their effect on lithography, ©2002 Society of Photo-Optical Instrumentation Engineers, Nikon Precision, Inc., 1399 Shoreway Road, Belmont, CA 94002, USA.

(Continued)

*Primary Examiner* — Toan Ton
*Assistant Examiner* — Michelle Iacoletti
(74) *Attorney, Agent, or Firm* — Roeder & Broder LLP (57) ABSTRACT

A method for matching a first OPE curve (700) for a first exposure apparatus (10A) used to transfer an image to a wafer (28) to a second OPE curve (702) of a second exposure apparatus (10B). The method can include the step of adjusting a tilt of a wafer stage (50) that retains the wafer to adjust the first OPE curve. As provided herein, the first exposure apparatus (10A) has the first OPE curve (700) because of the design of the components used in the first exposure apparatus (10A), and the second exposure apparatus (10B) has a second OPE curve (702) because of the design of the components used in the second exposure apparatus (10B). Further, the tilt of the wafer stage (50) can be selectively adjusted until the first OPE curve (700) approximately matches the second OPE curve (702). With this design, the two exposure apparatuses (10A) (10B) can be used for the same lithographic process. Stated in another fashion, exposure apparatuses (10A) (10B) from different manufacturers, when using the same reticle (26), will transfer similar images to the wafer (28).

20 Claims, 8 Drawing Sheets

U.S. PATENT DOCUMENTS

2006/0192935 A1* 8/2006 Hansen et al. .................. 355/69
2010/0058263 A1* 3/2010 Tyminski et al. ................. 716/5

FOREIGN PATENT DOCUMENTS

WO WO2008/089222 A1 7/2008

OTHER PUBLICATIONS

Stephen P. Renwick, What makes a coherence curve change?(SPIE, Bellingham, WA, 2005) pp. 1537-1547, Optical Microlithography XVIII, Proceedings of SPIE vol. 5754, Nikon Precision, Inc., USA, contact author: srenwick@nikon.com.

Stephen P. Renwick, Scanner OPC signatures: automatic vendor-to-vendor OPE matching, ©2009 SPIE, Optical Microlithography XXII, Proceedings of SPIE vol. 7274, 72740Q, contact author: srenwick@nikon.com.

T. Brunner et al., "Laser bandwidth and other sources of focus blur in lithography," 2006, Proceedings of SPIE in 2006, IBM SRDC, Hopewell Junction NY 12533 and KLA-Tencor, Austin, TX 78759 US.

L. Van Look, et al., "Tool-to-tool optical proximity effect matching,"SPIE, IMEC vzw, Kapeldreef 75, B-3001 Heverlee, Belgium, ASML, De Run 6501, 5504 DR Veldhoven, The Netherlands.

\* cited by examiner

SYSTEM AND METHOD FOR AN ADJUSTING OPTICAL PROXIMITY EFFECT FOR AN EXPOSURE APPARATUS

RELATED INVENTIONS

This application claims priority on U.S. Provisional Application Ser. No. 61/030,934, filed Feb. 22, 2008 and entitled "Scanner-To-Scanner OPE Matching". As far as permitted, the contents of U.S. Provisional Application Ser. No. 61/030,934 are incorporated herein by reference.

BACKGROUND

Exposure apparatuses for semiconductor processing are commonly used to transfer images from a reticle onto a semiconductor wafer during semiconductor processing. A typical exposure apparatus includes (i) an illumination system having an illumination source and an illumination optical assembly, (i) a reticle stage assembly that positions a reticle, (iii) a projection optical assembly, and (iv) a wafer stage assembly that positions a semiconductor wafer. With this design, the illumination system illuminates the reticle to transfer images to the wafer.

Lithographers commonly desire to use exposure apparatuses from different manufacturers for the same lithographic process. Unfortunately, exposure apparatuses from different manufacturers exhibit different behavior in optical proximity effects ("OPE"). This can be caused by the unavoidable differences in (i) the illumination sources, (ii) the illumination optical assemblies, (iii) the projection optical assemblies, and/or (iv) the synchronization between the reticle stage assembly and the wafer stage assembly. As a result thereof, exposure apparatuses from different manufacturers, when using the same reticle, will transfer different images to the wafer. Thus, the exposure apparatuses from different manufacturers are not interchangeable.

SUMMARY

The present invention is directed to a method for matching a first OPE curve for a first exposure apparatus used to transfer an image to a wafer to a second OPE curve of a second exposure apparatus. The method includes the step of adjusting a tilt of a wafer stage that retains the wafer to adjust the first OPE curve. As an overview, the first exposure apparatus has the first OPE curve because of the design of the components used in the first exposure apparatus, and the second exposure apparatus has a second OPE curve because of the design of the components used in the second exposure apparatus. Further, as provided herein, the tilt of the wafer stage can be selectively adjusted until the first OPE curve approximately matches the second OPE curve. With this design, the two exposure apparatuses can be used for the same lithographic process. Stated in another fashion, exposure apparatuses from different manufacturers, when using the same reticle, will transfer similar images to a wafer.

As used herein, the term optical proximity effects ("OPE") shall mean the unavoidable differences in width, also known as critical dimension ("CD") of images of features that have the same width on the reticle due to differing proximity of one feature to its neighbor, where the distance from the center of one image to its nearest neighbor is referred to as "pitch". Further, the term "OPE curve" shall mean a graph of image CD vs. pitch for features of similar CD but different pitches. Moreover, as used herein, the term "approximately matches" shall mean that the CDs through pitch of the first exposure apparatus are as close as possible to the CDs through pitch of the second exposure apparatus. For example, with certain non-exclusive designs, the first OPE curve approximately matches the second OPE curve when an RMS difference of the CD through pitch of the first exposure apparatus when compared to the CD through pitch of the second exposure apparatus is approximately five nanometers or less. In another non-exclusive design, the first OPE curve approximately matches the second OPE curve when an RMS difference of the CD through pitch of the first exposure apparatus when compared to the CD through pitch of the second exposure apparatus is approximately two nanometers or less.

In one embodiment, the method includes the step of lithographic modeling to estimate the first OPE curve of the first exposure apparatus with the wafer stage at a plurality of alternative adjustment angles. With this design, the matching process can be done without test exposures to the wafer. This reduces the cost of matching the exposure apparatuses.

Additionally, the present invention can further include at least one or more of the steps of: (i) adjusting a numerical aperture (NA) of a projection optical assembly of the first exposure apparatus to adjust the first OPE curve; (ii) adjusting a numerical aperture of an illumination system of the first exposure apparatus to adjust the first OPE curve; (iii) adjusting a wavelength spectrum of an illumination system of the first exposure apparatus to adjust the first OPE curve; (iv) adjusting an annular ratio of an illumination system of the first exposure apparatus to adjust the first OPE curve; and (v) adjusting a scan synchronization of a reticle stage and the wafer stage of the first exposure apparatus to adjust the first OPE.

Moreover, the present invention is direct to a method of making a wafer that includes the steps of providing a substrate, matching the first OPE curve to the second OPE curve and forming an image on the substrate with the first exposure apparatus.

In another embodiment, the present invention comprises the steps of (i) retaining the wafer with a wafer stage, the wafer stage being tiltable about a first tilting axis; (ii) estimating the first OPE curve with lithographic modeling of the first exposure apparatus with the wafer stage at a plurality of alternative adjustment angles; and (iii) adjusting a tilt of a wafer stage that retains the wafer to adjust the first OPE curve until the first OPE curve approximately matches the second OPE curve.

The present invention is also direct to a first exposure apparatus for transferring an image to a wafer, the first exposure apparatus having an initial first OPE curve that is different than a second OPE curve of a second exposure apparatus. In one embodiment, the first exposure apparatus includes (i) a wafer stage that retains the wafer; (ii) a wafer stage mover for moving the wafer stage and the wafer along a scan axis and about a tilting axis that is orthogonal to the scan axis; and (iii) an OPE adjuster that controls the wafer stage mover to rotate the wafer stage and the wafer about the tilting axis to adjust the initial first OPE curve of the first exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
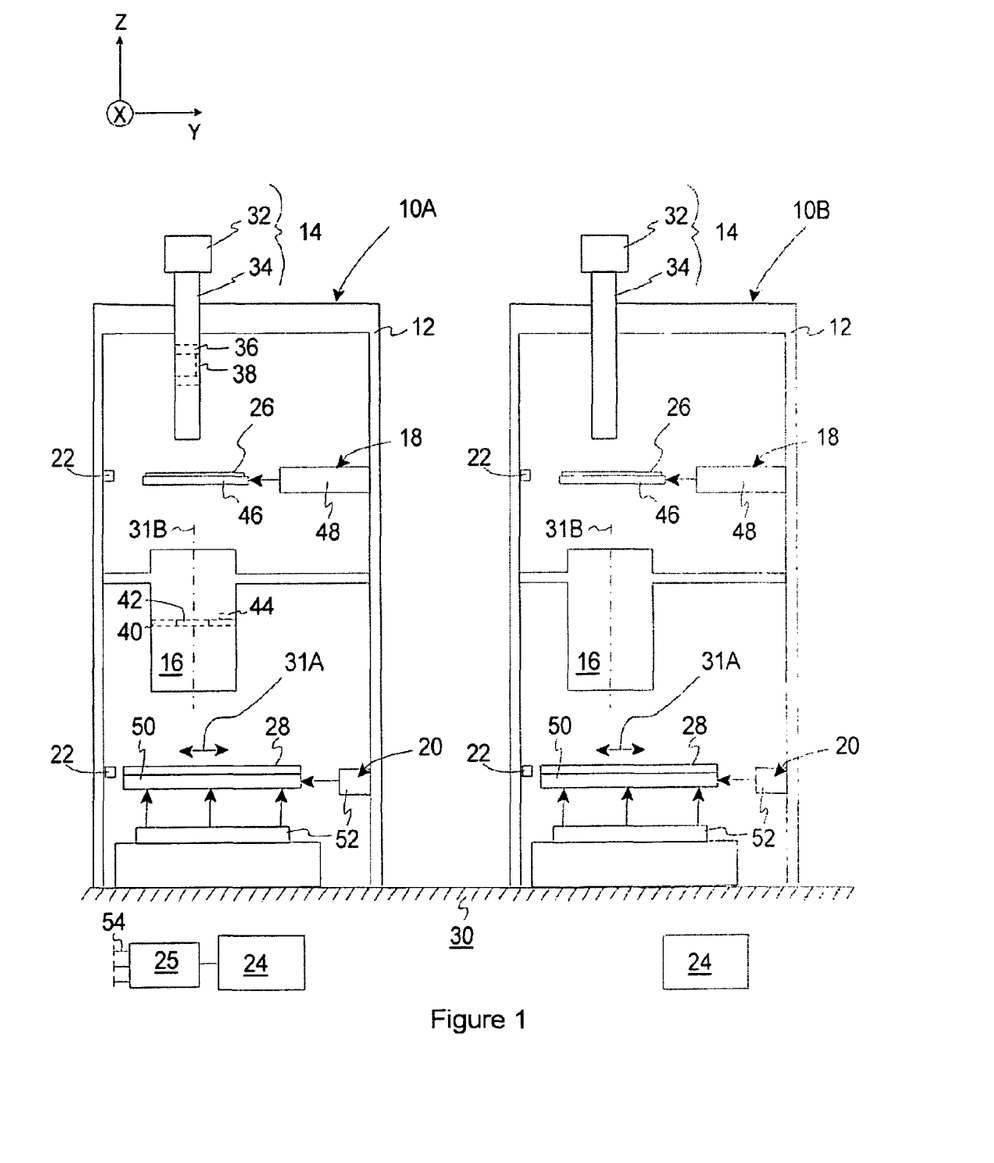
FIG. 1 is a schematic illustration of an assembly having features of the present invention.

FIG. 1 is a schematic illustration of a precision assembly, that includes a first exposure apparatus 10A having features of the present invention and a second exposure apparatus 10B. The design of the components of each exposure apparatus 10A, 10B can be varied pursuant to the teachings provided herein. As illustrated in FIG. 1, the exposure apparatuses 10A, 10B can be somewhat similar in design. Alternatively, the exposure apparatuses 10A, 10B can be quite different. For example, the exposure apparatuses 10A, 10B can be made by different manufacturers.

In one embodiment, each exposure apparatus 10A, 10B includes an apparatus frame 12, an illumination system 14 (irradiation apparatus), a projection optical assembly 16, a reticle stage assembly 18, a wafer stage assembly 20, a measurement system 22, and a control system 24. Further, the first exposure apparatus 10A includes an OPE adjuster 25 that selective adjusts the OPE for the first exposure apparatus 10A.

As an overview, the first exposure apparatus 10A has a first OPE curve 700 (illustrated in FIG. 7) because of the design of the components used in the first exposure apparatus 10A, and the second exposure apparatus 10B has a second OPE curve 702 (illustrated in FIG. 7) because of the design of the components used in the second exposure apparatus 10A. Further, as provided herein, the OPE adjuster 25 can be used to selectively adjust the first OPE curve 700 of the first exposure apparatus 10A so that the first exposure apparatus 10A has an adjusted OPE curve 704 (illustrated in FIG. 7). As a result thereof, the OPE adjuster 25 can be manipulated until the adjusted OPE curve 704 of the first exposure apparatus 10A approaches and is relatively close to the second OPE curve 702 of the second exposure apparatus 10B. Stated in another fashion, the OPE adjuster 25 can be manipulated until the adjusted OPE curve 704 of the first exposure apparatus 10A matches the second OPE curve 702 of the second exposure apparatus 10B. With this design, the two exposure apparatuses 10A, 10B can be used for the same lithographic process. Stated in another fashion, exposure apparatuses 10A, 10B from different manufacturers, when using the same reticle 26, will transfer similar images to a wafer 28.

A number of Figures include an orientation system that illustrates an X axis, a Y axis that is orthogonal to the X axis and a Z axis that is orthogonal to the X and Y axes. It should be noted that any of these axes can also be referred to as the first, second, and/or third axes.

The exposure apparatuses 10A, 10B are particularly useful as a lithographic device that transfers a pattern (not shown) of an integrated circuit from the reticle 26 onto the semiconductor wafer 28. The exposure apparatuses 10A, 10B mount to a mounting base 30, e.g., the ground, a base, or floor or some other supporting structure.

There are a number of different types of lithographic devices. For example, the exposure apparatuses 10A, 10B can be a step-and-scan type photolithography system that exposes the wafer 28 while the reticle 26 and the wafer 28 are stationary. In the step and scan process, the wafer 28 is in a constant position relative to the reticle 26 and the projection optical assembly 16 during the exposure of an individual field. Subsequently, between consecutive exposure steps, the wafer 28 is consecutively moved along a scan axis 31A (e.g. the Y axis in FIG. 1) with the wafer stage assembly 20 perpendicularly to an optical axis 31B (e.g. the Z axis in FIG. 1) of the optical assembly 16 so that the next field of the wafer 28 is brought into position relative to the projection optical assembly 16 and the reticle 26 for exposure. Following this process, the images on the reticle 26 are sequentially exposed onto the fields of the wafer 28, and then the next field of the wafer 28 is brought into position relative to the optical assembly 16 and the reticle 26.

However, the use of the exposure apparatuses 10A, 10B provided herein are not limited to a photolithography system for semiconductor manufacturing. The exposure apparatuses 10A, 10B, for example, can be used as an LCD photolithography system that exposes a liquid crystal display device pattern onto a rectangular glass plate or a photolithography system for manufacturing a thin film magnetic head.

The apparatus frame 12 is rigid and supports the components of the respective exposure apparatus 10A, 10B. The apparatus frame 12 illustrated in FIG. 1 supports the reticle stage assembly 18, the optical assembly 16 and the illumination system 14 for the respective exposure apparatus 10A, 10B above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the reticle 26. The beam illuminates selectively different portions of the reticle 26 and exposes the wafer 28. In FIG. 1, the illumination source 32 is illustrated as being supported above the reticle stage assembly 18. However, the illumination source 32 can be secured to one of the sides of the apparatus frame 12 and the energy beam from the illumination source 32 can be directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm) or a $F_2$ laser (157 nm). Alternatively, the illumination source 32 can generate beams such as an extreme ultraviolet or x-ray beams.

In certain embodiments, the illumination optical assembly 34 of the first exposure apparatus 10A can include one or more lenses 36 (illustrated as boxes in phantom) that can be selectively moved by a lens mover 38 (illustrated as a box in phantom) to adjust a sigma of the illumination system 14.

The projection optical assembly 16 projects and/or focuses the light from the reticle 26 to the wafer 28. Depending upon the design of the exposure apparatuses 10A, 10B, the projection optical assembly 16 can magnify or reduce the image illuminated on the reticle 26. It could also be a 1× system.

In certain embodiments, the projection optical assembly 16 of the first exposure apparatus 10A can include a plate 40 (illustrated as a box in phantom) having an aperture 42 (illustrated as a box in phantom) with a size that is adjustable with an aperture mover 44 (illustrated as a box in phantom) to selectively adjust a numerical aperture of the projection optical assembly 16.

The reticle stage assembly 18 holds and positions the reticle 26 relative to the projection optical assembly 16 and the wafer 28. The reticle stage assembly 18 can include a reticle stage 46, and a reticle stage mover 48. The size, shape, and design of each these components can be varied. The reticle stage 46 retains the reticle 26 and can include a chuck (not shown) for holding the reticle 26.

The reticle stage mover 48 moves and positions the reticle stage 46. For example, the reticle stage mover 48 can move the reticle stage 46 and the reticle 26 along the Y axis, along the X axis, and about the Z axis. Alternatively, for example, the reticle stage mover 48 for one or both of the exposure apparatuses 10A, 10B could be designed to move the reticle stage 46 and the reticle 26 with more than three degrees of freedom, or less than three degrees of freedom. For example, the reticle stage mover 48 can include one or more linear motors, rotary motors, planar motors, voice coil actuators, or other type of actuators.

Somewhat similarly, the wafer stage assembly 20 holds and positions the wafer 28 with respect to the projected image of the illuminated portions of the reticle 26. The wafer stage assembly 20 can include a wafer stage 50, and a wafer stage mover 52. The size, shape, and design of each these components can be varied. The wafer stage 50 retains the wafer 28 and can include a chuck (not shown) for holding the wafer 28.

The wafer stage mover 52 moves and positions the wafer stage 50. For example, the wafer stage mover 52 can move the wafer stage 50 and the wafer 28 along the X, Y and Z axes, and about the X, Y and Z axes. Alternatively, for example, the wafer stage mover 52 for one or both of the exposure apparatuses 10A, 10B could be designed to move the wafer stage 50 and the wafer 28 with less than six degrees of freedom. For example, the wafer stage mover 52 can include one or more linear motors, rotary motors, planar motors, voice coil actuators, or other type of actuators.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

For each exposure apparatus 10A, 10B, the measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

For each exposure apparatus 10A, 10B, the control system 24 is connected to the reticle stage assembly 18, the wafer stage assembly 20, and the measurement system 22. The control system 24 receives information from the measurement system 22 and controls the stage mover assemblies 18, 20 to precisely position the reticle 26 and the wafer 28. Further, in certain embodiments, the control system 24 can control the illumination source 32 to adjust the illumination beam, the lens mover 38 to adjust the sigma, and/or the aperture mover 44 to adjust the numerical aperture. The control system 24 can include one or more processors and circuits.

The OPE adjuster 25 is used to precisely adjust the OPE of the first exposure apparatus 10A to enable precise matching of OPE effects due to laser-bandwidth differences, scan-synchronization differences, and similar effects that are difficult to compensate for directly. In FIG. 1, the OPE adjuster 25 is electrically connected to the control system 24 of the first exposure apparatus 10A. Alternatively, for example, the OPE adjuster 25 can be directly integrated into the control system 24.

In one embodiment, the OPE adjuster 25 includes one or more control switches 54 that can be controlled by a user to selectively vary the tool parameters of the first exposure apparatus 10A to selectively adjust the adjusted OPE 704. For example, in FIG. 1, the OPE adjuster 25 includes three separate control switches 54. Alternatively, the OPE adjuster 25 can include more than three or fewer than three separate control switches 54.

Moreover, in FIG. 1, each control switch 54 is illustrated as a knob that can be selectively rotated to adjust a tool parameter to tune the adjusted OPE 704. Alternatively, for example, one or more of the control switches 54 can include one or more buttons that can be depressed to tune the adjusted OPE 704.

It should be noted that although the OPE adjuster 25 is illustrated as having multiple control switches 54, the OPE adjuster 25 could be designed without the control switches 54. In this design, the OPE adjuster 25 can include software that performs the calculation and electronically provides the adjustments to the components described herein.

The adjustments made by the control switches 54 can vary pursuant to the teachings provided herein. In one embodiment, one of the control switches 54 can cause the wafer stage mover 52 to adjust the tilt of the wafer 28 and the wafer stage 50 about the X axis. As provided herein, movement of the wafer 28 about the X axis adjusts the OPE of the first exposure apparatus 10A. This feature is discussed in more detail below.

Additionally, the control switches 54 can be used to selectively control and adjust one or more of (i) the lens mover 38 to adjust the sigma, (ii) the aperture mover 44 to adjust the numerical aperture, and/or (iii) the illumination source 32 to adjust the characteristics of the illumination beam. As provided herein, the OPE of the first exposure apparatus 10A can further be changed by adjusting the sigma, adjusting the numerical aperture, and/or adjusting the characteristics of the illumination beam.

Figure 2:
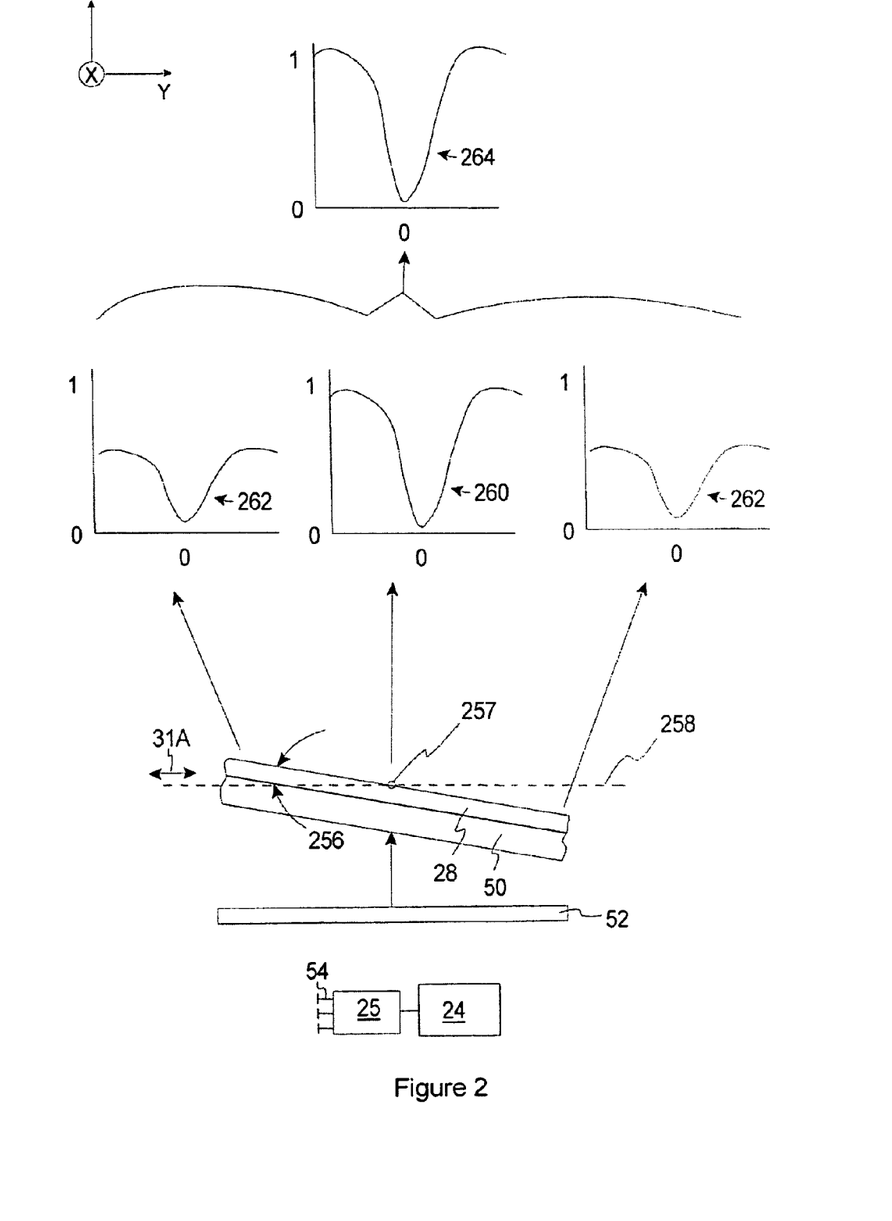
FIG. 2 is a simplified side view of a portion of a wafer stage having features of the present invention, a wafer, and a plurality of aerial images.

FIG. 2 is a simplified side view of a portion of the wafer 28, a portion of the wafer stage 50, the wafer stage mover 52, the control system 24, and the OPE adjuster 25. In this embodiment, one of the control switches 54 is being used to control the wafer stage mover 52 to rotate the wafer stage 50 and the wafer 28 an adjustment angle 256 about a tilting axis 257 (e.g. the X axis in FIG. 2) relative to the flat Z plane 258. In this embodiment, the tilting axis 257 is perpendicular to both the scan axis 31A and the optical axis 31B (illustrated in FIG. 1). It should be noted that the rotation of the wafer 28 is FIG. 2 is greatly exaggerated for clarity.

As provided herein, deliberately induced wafer 28 tilt out of the flat Z plane 258 causes a portion of the images transferred to the wafer 28 to be out of focus. FIG. 2 illustrates a number of graphs that represent aerial images that are being transferred to the wafer 28. Because the wafer 28 is tilted out of the flat Z plane 258, a focused aerial image 260 and unfocused aerial images 262 are being transferred to the wafer 28. The focused aerial image 260 is transferred to the wafer 28 near the tilting axis 257 because the wafer 28 is properly focused at this location. In contrast, the unfocused aerial images 262 are transferred to the wafer 28 away from the tilting axis 257 because the wafer 28 is not properly focused at these locations. It should be noted that only three of the aerial images 260, 262 are shown that make up the composite aerial image 264. However, every location at the wafer 28 will have a different aerial image based upon the level of focus of that portion of the wafer 28.

The focused aerial images 260 and unfocused aerial images 262 are summed to provide a composite aerial image 264 that is transferred to the wafer 28. As a result thereof, tilting of wafer 28 adds out-of focus images 262 to best-focus image 260 to generate the composite aerial image 264. Thus, the amount of tilting can be precisely controlled to precisely control the characteristics of the composite aerial image 264 that is being transferred to the wafer 28.

The amount of rotation (tilting) necessary to provide the desired adjustment to the OPE will vary. In non-exclusive embodiments, the adjustment angle 256 can be between approximately 0.0 to 0.1 milliradians.

Figure 7:
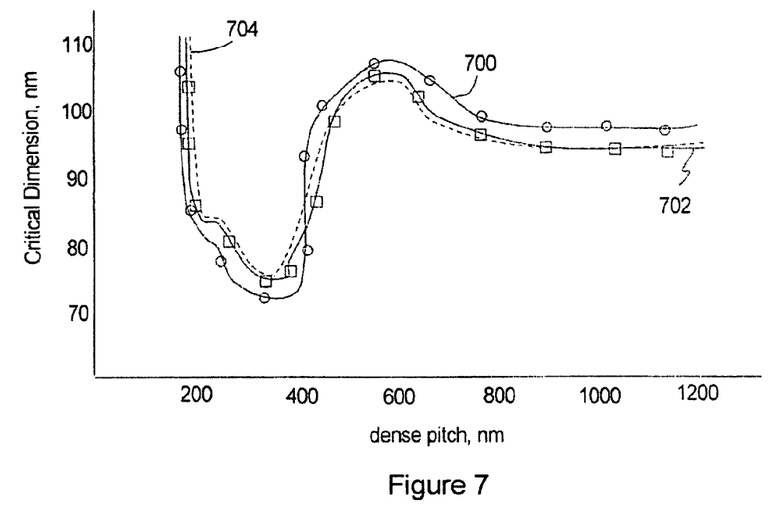
FIG. 7 is a simplified graph that illustrates an OPE for alternative exposure apparatuses.

It should be noted that the sensitivity of the first OPE curve 700 of the first exposure apparatus 10A to the tilting of the wafer 28 can be determined utilizing lithographic modeling software (e.g. Prolith software sold by KLA-Tencor Corp., located in Austin, Tex.), along with the other settings of the exposure apparatus 10A and the resist and feature information. With this design, the first OPE curve for a number of different adjustment angles 256 can be calculated using the lithographic modeling software.

Figure 3A:
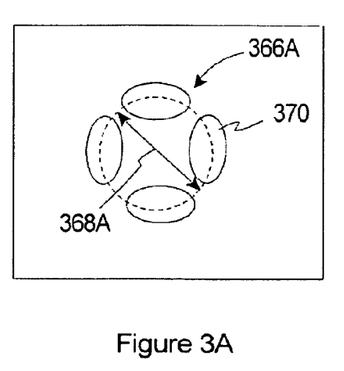
FIGS. 3A and 3B are simplified illustrations of an illumination pattern with different sigmas, where "sigma" is the ratio of illumination apparatus NA to projection lens NA.
Figure 3B:
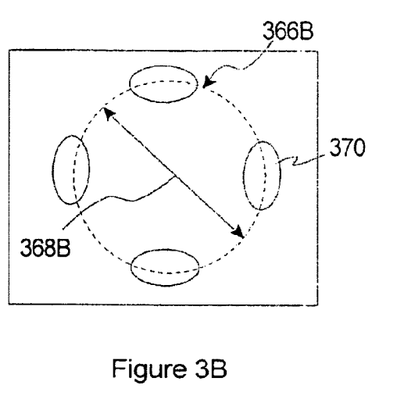

FIG. 3A is simplified illustration of a first illumination pattern 366A having a first sigma 368A that is generated by the illumination system 14 (illustrated in FIG. 1) of the first exposure apparatus 10A (illustrated in FIG. 1), and FIG. 3B is simplified illustration of a second illumination pattern 366B having a second sigma 368B that is also generated by the illumination system 14 (illustrated in FIG. 1) of the first exposure apparatus 10A (illustrated in FIG. 1). In these non-exclusive examples, each illumination pattern 366A, 366B includes four illumination beam portions 370 and the term sigma 368A, 368B represents the diameter of the four illumination beam portions 370. Comparing FIGS. 3A and 3B, the second sigma 368B is greater than the first sigma 368A.

In this embodiment, one of the control switches 54 (illustrated in FIG. 1) can be precisely controlled to control the lens mover 38 (illustrated in FIG. 1) to move the lenses 36 and adjust the sigma 368A, 368B of the illumination system 14. It should be noted that the characteristics of the aerial pattern (not shown in FIGS. 3A and 3B) that is transferred to the wafer 28 (not shown in FIGS. 3A and 3B), and the value of the OPE will depend the characteristics of the illumination system 14 including the sigma 368A, 368B of the illumination beam portions 370. Thus, the value of the OPE can be adjusted by adjusting the sigma 368A, 368B.

It should be noted that the sensitivity of the OPE curve 700 of the first exposure apparatus 10A to possible sigma 368A, 368B changes can be determined utilizing lithographic modeling software, along with the other settings of the exposure apparatus 10A and the resist and feature information.

Figure 4A:
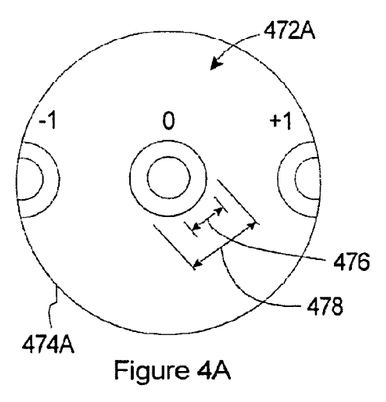
FIGS. 4A and 4B are simplified illustrations of a pupil fill with different numerical apertures.
Figure 4B:
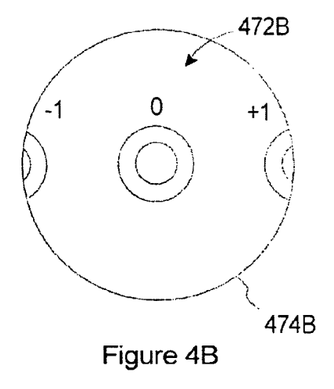

FIG. 4A illustrates a first pupil fill 472A created by a first numerical aperture 474A of the projection optical assembly 16 (illustrated in FIG. 1) and FIG. 4B illustrates a second pupil fill 472B created by a second numerical aperture 474B of the projection optical assembly 16. In these non-exclusive examples, each pupil fill 472A, 472B includes −1, 0, and +1 diffraction orders locations in the pupil plane. FIGS. 4A and 4B illustrate that the −1 and +1 orders are cut off by the lens numerical aperture. Further, these Figures illustrate that more of the −1 and +1 orders are cut off by the smaller second numerical aperture 474B than the larger first numerical aperture 474A.

It should be noted that the projection optical assembly 16 forms images by recombining the −1, 0, and +1 diffraction orders. Thus, the characteristics of the aerial pattern (not shown in FIGS. 4A and 4B) that is transferred to the wafer 28 (not shown in FIGS. 4A and 4B), and the value of the OPE will depend the numerical aperture and how much of the −1 and +1 orders are cut off. Thus, the value of the OPE can be adjusted by adjusting the numerical aperture.

In this embodiment, one of the control switches 54 (illustrated in FIG. 1) can be precisely controlled to control the aperture mover 44 (illustrated in FIG. 1) to adjust the size of the aperture 42, the numerical aperture of the projection optical assembly 16, and the OPE.

It should be noted that the sensitivity of the OPE curve 700 of the first exposure apparatus 10A to possible numerical aperture changes can be determined utilizing lithographic modeling software, along with the other settings of the exposure apparatus 10A and the resist and feature information.

Further, the diffraction orders can have a sigma inner 476 and a sigma outer 478 that each be adjusted to adjust the OPE of the system. More specifically, the term annular ratio represents the ratio of the sigma inner 476 to the sigma outer 478 of the diffraction orders. In one embodiment, one of the control switches 54 (illustrated in FIG. 1) can be used to precisely adjust the annular ratio by selection of particular diffracting optical elements and by controlled movement of refracting optical elements within the illumination apparatus Moreover, one of the control switches 54 (illustrated in FIG. 1) can be used to precisely adjust a scan synchronization between the reticle stage 46 (illustrated in FIG. 1) and the wafer stage 50 (illustrated in FIG. 1). By adjusting the scan synchronization, different aerial images are transferred to the wafer due to mismatched position between the reticle and wafer stages to form an adjusted composite image. The scan synchronization can be adjusted by adjusting the relative positions between the reticle 26 and the wafer 28 throughout the scan.

Figure 5A:
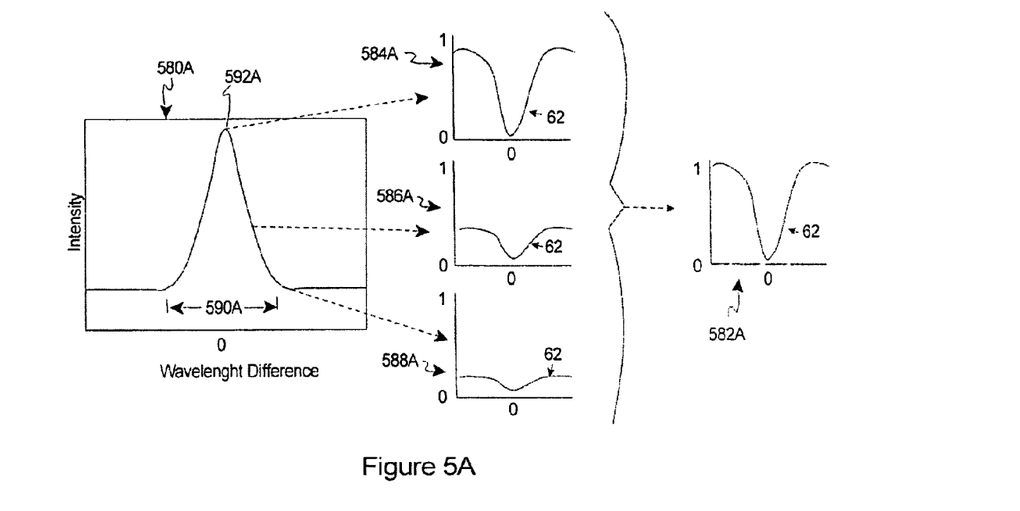
FIGS. 5A and 5B are simplified illustrations of alternative laser spectra and the resulting aerial images.

FIG. 5A illustrates a first laser spectrum 580A generated by the illumination source 32 (illustrated in FIG. 1), a composite aerial image 582A, a center wavelength aerial image 584A, a first off-center aerial image 586A, and a second off-center aerial image 588A. Referring to the first laser spectrum 580A, the illumination beam from the illumination source 32 has a relatively narrow first wavelength spectrum 590A with a first center wavelength 592A and a small amount of wavelengths near the first center wavelength 592A. In one example, the first center wavelength 592A is approximately 193.000 nanometers, and the first wavelength spectrum 590A is approximately plus or minus 0.002 nanometers (e.g. 192.998 to 193.002) relative to the center wavelength 592A.

The lenses in the system all have some chromatic aberration. As a result thereof, the image transferred to the wafer 28 (illustrated in FIG. 1) degrades slightly off the first center wavelength 592A. Thus, the center wavelength aerial image 584A transferred by the portion of the illumination beam that is at the first center wavelength 592A is very bright. Alternatively, away from the first center wavelength 592A, the brightness of the off-center aerial images 586A, 588A decreases. Thus, the center wavelength image is the brightest and unaberrated, while the others are darker and degraded. For example, the first off-center aerial image 586A is transferred by the portion of the illumination beam that is slightly off of the first center wavelength 592A, and the second off-center aerial image 588A is transferred by the portion of the illumination beam that is near the edge of the first wavelength spectrum 590A.

It should be noted that only three of the aerial images 584A, 586A, 588A are shown that make up the composite aerial image 582A. However, every location along the first wavelength spectrum 590A will have a different aerial image based upon its wavelength.

The projection optical assembly 16 (illustrated in FIG. 1) projects a composite of the many different images with the different intensities. Thus, the different aerial images 584A, 586A, 588A combine together to make the composite aerial image 582A that is transferred to the wafer 28.

Figure 5B:
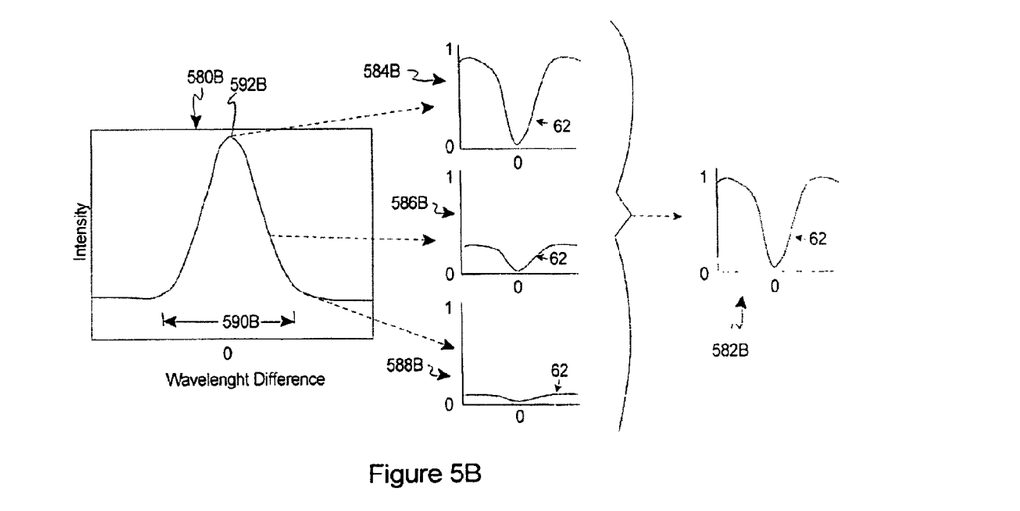

FIG. 5B illustrates a second laser spectrum 580B that can be generated by the illumination source 32 (illustrated in FIG. 1), a resulting composite aerial image 582B, a center wavelength aerial image 584B, a first off-center wavelength aerial image 586B, and a second off-center wavelength aerial image 588B. Referring to the second laser spectrum 580B, the illumination beam from the illumination source 32 has a narrow second wavelength spectrum 590B with a second center wavelength 592B. In this example, the second wavelength spectrum 590B is wider than the first wavelength spectrum 590A (illustrated in FIG. 5A), and second center wavelength 592B is still equal to the first center wavelength 592A (illustrated in FIG. 5A). For example, the second center wavelength 592B can be approximately 193.000 nanometers, and the second wavelength spectrum 590B can be approximately plus or minus 0.003 nanometers (e.g. 192.997 to 193.003).

FIG. 5B also illustrates that the image transferred to the wafer 28 (illustrated in FIG. 1) again degrades away from the second center wavelength 592B. Thus, the center wavelength aerial image 584B transferred by the portion of the illumination beam that is at the second center wavelength 592B is very bright. Alternatively, away from the second center wavelength 592B, the brightness of the off-center aerial images 586B, 588B decreases. Because the second wavelength spectrum 590B is wider than the first wavelength spectrum 590A, the first off-center aerial image 586B and the second off-center aerial image 588B are more degraded than the corresponding aerial images 586A, 586B from FIG. 5A. As a result thereof, the resulting composite aerial image 582B is different from the composite aerial image 582A from FIG. 5A.

Thus, the OPE of the system, and the image transferred to the wafer can be varied by varying the wavelength spectrum 590B of the illumination beam from the illumination source 32.

In this embodiment, one of the control switches 54 (illustrated in FIG. 1) can be precisely controlled to control the illumination source 32 to widen or narrow the wavelength spectrum 590A, 590B to adjust the OPE.

It should be noted that the sensitivity of the OPE curve 700 of the first exposure apparatus 10A to possible bandwidth changes can be determined utilizing lithographic modeling software, along with the other settings of the exposure apparatus 10A and the resist and feature information.

Figure 6:
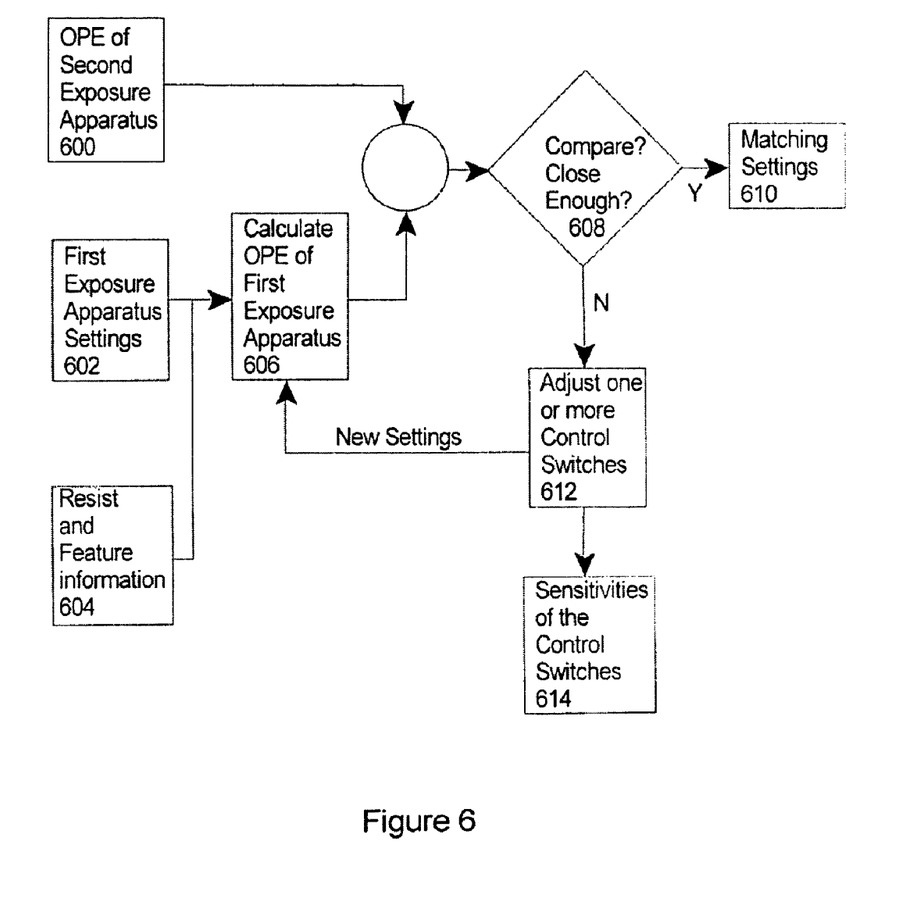
FIG. 6 is a flow chart that illustrates one embodiment of a process having features of the present invention.

FIG. 6 is a flow chart that illustrates one embodiment of a process having features of the present invention. In this embodiment, at step 600, the second OPE curve 702 (illustrated in FIG. 7) of the second exposure apparatus 10B is provided. The second OPE curve 702 can be obtained during usage of the second exposure apparatus 10B without knowledge of the proprietary details of the second exposure apparatus 10B.

Next, at step 602, the initial settings (e.g. the tilt of the wafer, the bandwidth of the illumination source, the numerical aperture, the sigma, the annular ratio) of the first exposure apparatus 10A are evaluated. Further, at step 604 the resist and feature information are provided. Next, at step 606, the first OPE curve 700 (FIG. 7) of the first exposure apparatus 10A is calculated using lithographic modeling software inputted with the initial settings and the resist and feature information.

Subsequently, at step 608, the first OPE curve 700 is compared to the second OPE curve 702. If the first OPE curve 700 is close enough to the second OPE curve 702, the OPE settings match at step 610. Alternatively, if the first OPE curve 700 is not close enough to the second OPE curve 702, then one or more of the control switches 54 are manipulated in the lithographic modeling calculation to adjust the OPE of the first exposure apparatus 10A. Box 614 represents the sensitivities of first exposure apparatus 10A to the adjustment by the various control switches 54.

Next, the adjusted settings (e.g. the tilt of the wafer, the bandwidth of the illumination source, the numerical aperture, the sigma, the annular ratio) of the first exposure apparatus 10A are combined with the resist and feature information to calculate (with lithographic modeling) the adjusted OPE curve 704 (illustrated in FIG. 7). Subsequently, the adjusted OPE curve 704 is compared to the second OPE curve 702. If the adjusted OPE curve 704 is close enough to the second OPE curve 702, the OPE settings match. Alternatively, if there is not a match, one or more of the control switches 54 are again adjusted and the lithographic modeling repeated until there is a sufficient enough match.

It should be noted that the matching process can be done without test exposures to the wafer. This reduces the cost of matching the exposure apparatuses 10A, 10B.

Further, it should be noted that the modeling calculations can be either via aerial image or in resist, as appropriate.

FIG. 7 is a simplified graph that illustrates the first OPE curve 700 (solid line with circles) (sometimes referred to a "initial first OPE curve") of the first exposure apparatus 10A (illustrated in FIG. 1), the second OPE curve 702 (solid line with squares) of the second exposure apparatus 10B (illustrated in FIG. 1), and the adjusted first OPE curve 704 (dashed line) of the first exposure apparatus 10A that was achieved through adjustment of one or more of the control switches 44 (illustrated in FIG. 1) as described above. As provided herein, one or more of the control switches 44 can be adjusted until the adjusted OPE curve 704 closely matches the second OPE curve 702. As a result thereof, exposure apparatuses 10A, 10B (illustrated in FIG. 1) from different manufacturers, when using the same reticle 26 (illustrated in FIG. 1), will transfer similar images to a wafer 28 (illustrated in FIG. 1).

Figure 8:
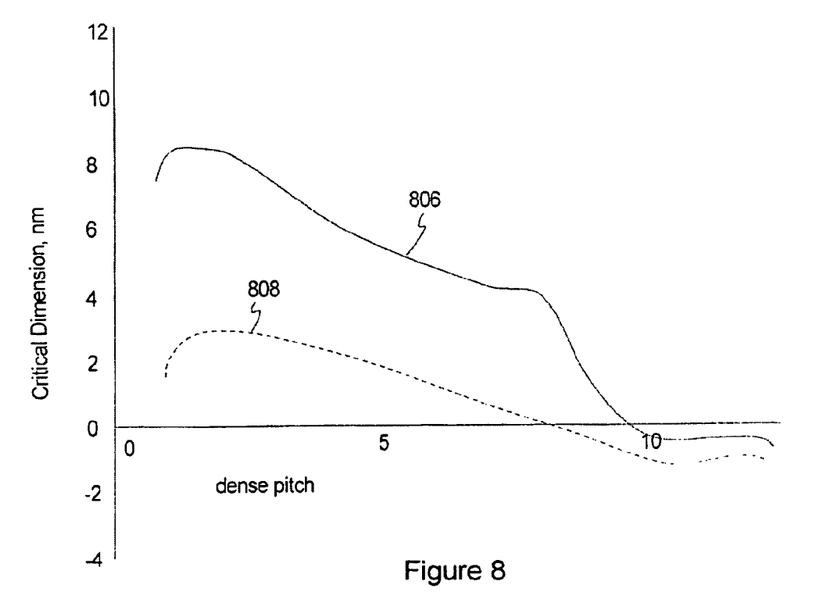
FIG. 8 is a simplified graph that illustrates a difference between OPE's of alternative exposure apparatuses.

FIG. 8 is a simplified graph that includes an original curve 806 (solid line) that represents the OPE difference between the first OPE curve 700 (illustrated in FIG. 7) and the second OPE curve 702 (illustrated in FIG. 7), and an adjusted curve 808 (dashed line) that represents the OPE difference between the adjusted OPE curve 704 (illustrated in FIG. 7) and the second OPE curve 702. FIG. 8 illustrates that the difference between the first OPE curve 700 and second OPE curve 702 is much greater than the difference between the adjusted OPE curve 704 and the second OPE curve 702. Thus, one or more of the control switches 44 (illustrated in FIG. 1) can be used to reduce the OPE difference between the exposure apparatuses 10A, 10B (illustrated in FIG. 1).

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9A:
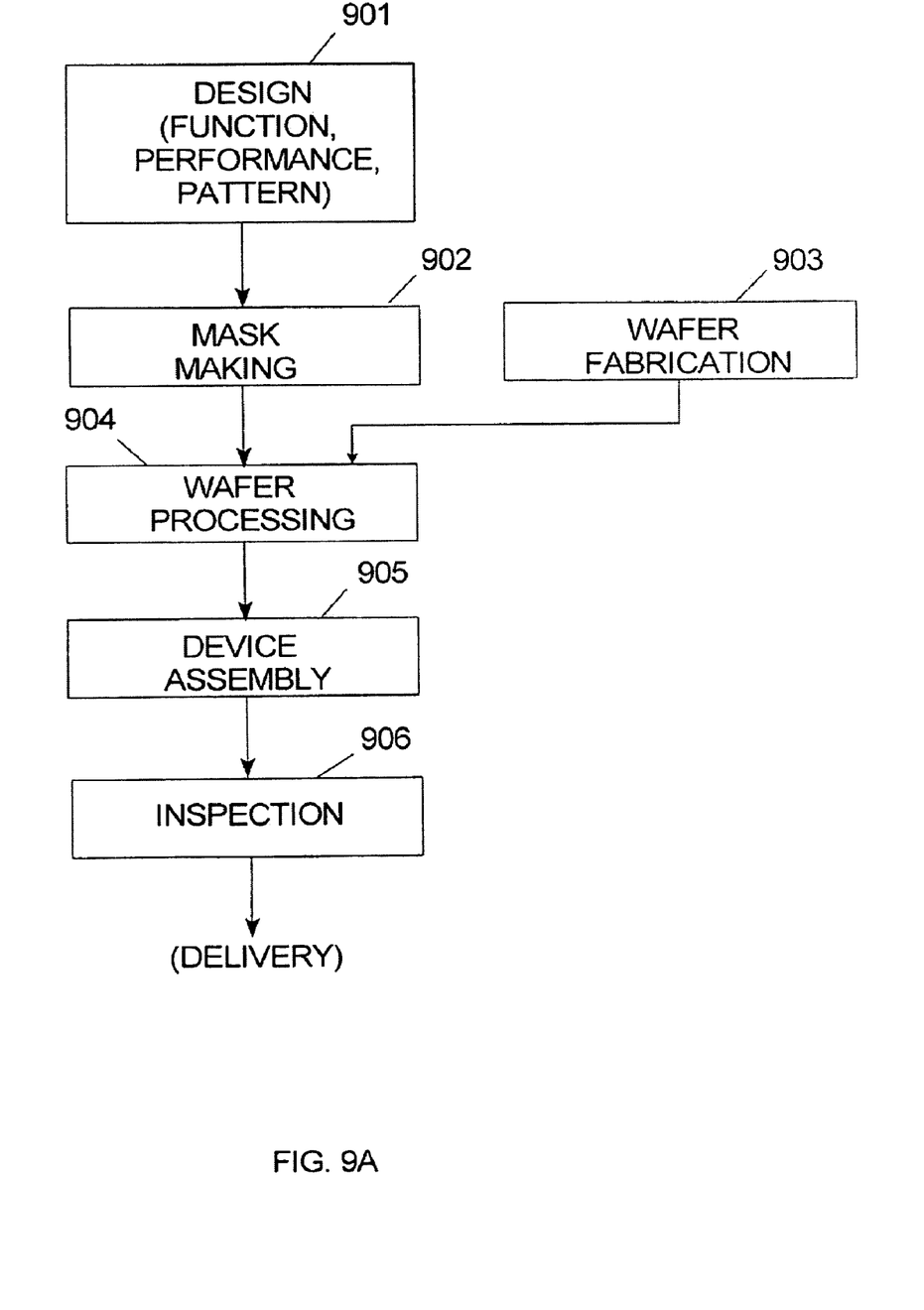
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905, the semiconductor device is assembled (including the dicing process, bonding process and packaging process), finally, the device is then inspected in step 906.

Figure 9B:
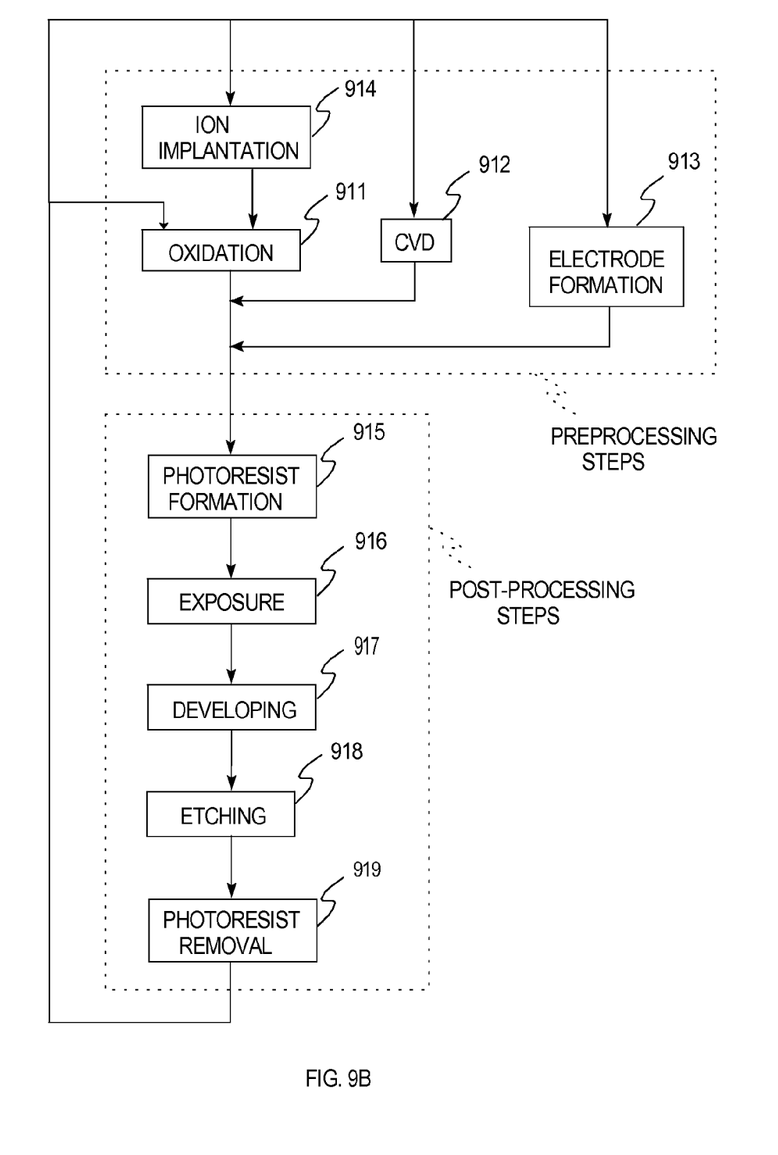
FIG. 9B is a flow chart that outlines device processing in more detail.

FIG. 9B illustrates a detailed flowchart example of the above-mentioned step 1104 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the designs as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for matching a first OPE curve for a first exposure apparatus to a second OPE curve of a second exposure apparatus, the first exposure apparatus being used to transfer an image to a wafer, the first exposure apparatus including a wafer stage that positions the wafer, the method comprising the steps of:
   estimating the first OPE curve with lithographic modeling of the first exposure apparatus and without test exposures of the wafer;
   estimating the second OPE curve with lithographic modeling of the second exposure apparatus and without test exposures of the wafer; and
   adjusting a tilt of the wafer stage that retains the wafer to adjust the first OPE curve until the estimated first OPE curve determined without test exposures of the wafer approximately matches the estimated second OPE curve determined without test exposures of the wafer.

2. The method of claim 1 wherein the step of estimating the first OPE curve includes estimating the first OPE curve with lithographic modeling at a plurality of alternative adjustment angles of the wafer stage.

3. The method of claim 1 further comprising the step of adjusting a numerical aperture of a projection optical assembly of the first exposure apparatus to adjust the first OPE curve.

4. The method of claim 1 further comprising the step of adjusting a sigma of an illumination system of the first exposure apparatus to adjust the first OPE curve.

5. The method of claim 1 further comprising the step of adjusting a wavelength spectrum of an illumination system of the first exposure apparatus to adjust the first OPE curve.

6. The method of claim 1 further comprising the step of adjusting an annular ratio of an illumination system of the first exposure apparatus to adjust the first OPE curve.

7. The method of claim 1 further comprising the step of adjusting a scan synchronization of a reticle stage and the wafer stage of the first exposure apparatus to adjust the first OPE curve.

8. The method of claim 1 further comprising at least two of the steps of: (i) adjusting a numerical aperture of a projection optical assembly of the first exposure apparatus to adjust the first OPE curve; (ii) adjusting a sigma of an illumination system of the first exposure apparatus to adjust the first OPE curve; (iii) adjusting a wavelength spectrum of an illumination system of the first exposure apparatus to adjust the first OPE curve; (iv) adjusting an annular ratio of an illumination system of the first exposure apparatus to adjust the first OPE curve; and (v) adjusting a scan synchronization of a reticle stage and the wafer stage of the first exposure apparatus to adjust the first OPE curve.

9. The method of claim 1 wherein the step of adjusting a tilt includes tilting the wafer stage about a tilting axis, the tilting axis being perpendicular to a scan axis, wherein the wafer is moved along the scan axis during the transfer of the image to the wafer.

10. A method of making a wafer including the steps of providing a substrate, matching the first OPE curve to the second OPE curve by the method of claim 1, and forming an image on the substrate with the first exposure apparatus.

11. A method for matching a first OPE curve for a first exposure apparatus to a second OPE curve of a second exposure apparatus, the first exposure apparatus being used to transfer an image to a wafer, the method comprising the steps of:
  retaining the wafer with a wafer stage, the wafer stage being tiltable about a tilting axis to a plurality of alternative adjustment angles, the wafer stage being movable along a scan axis during the transfer of the image to the wafer, wherein the tilting axis is perpendicular to the scan axis;
  estimating the second OPE curve of the second exposure apparatus with lithographic modeling and without test exposures of the wafer;
  estimating the first OPE curve with lithographic modeling of the first exposure apparatus with the wafer stage at each of the plurality of alternative adjustment angles and without test exposures of the wafer; and
  adjusting a tilt of a wafer stage that retains the wafer to adjust the first OPE curve until the first OPE curve determined without test exposures of the wafer approximately matches the second OPE curve determined without test exposures of the wafer.

12. The method of claim 11 further comprising the step of adjusting a numerical aperture of a projection optical assembly of the first exposure apparatus to adjust the first OPE curve.

13. The method of claim 11 further comprising the step of adjusting a sigma of an illumination system of the first exposure apparatus to adjust the first OPE curve.

14. The method of claim 11 further comprising the step of adjusting a wavelength spectrum of an illumination system of the first exposure apparatus to adjust the first OPE curve.

15. The method of claim 11 further comprising at least two of the steps of: (i) adjusting a numerical aperture of a projection optical assembly of the first exposure apparatus to adjust the first OPE curve; (ii) adjusting a sigma of an illumination system of the first exposure apparatus to adjust the first OPE curve; (iii) adjusting a wavelength spectrum of an illumination system of the first exposure apparatus to adjust the first OPE curve; (iv) adjusting an annular ratio of an illumination system of the first exposure apparatus to adjust the first OPE curve; and (v) adjusting a scan synchronization of a reticle stage and the wafer stage of the first exposure apparatus to adjust the first OPE curve.

16. A method of making a wafer including the steps of providing a substrate, matching the first OPE curve to the second OPE curve by the method of claim 11, and forming an image on the substrate with the first exposure apparatus.

17. A first exposure apparatus for transferring an image to a wafer, the first exposure apparatus having an initial first OPE curve that is different than a second OPE curve of a second exposure apparatus, the first exposure apparatus comprising:
  a wafer stage that retains the wafer;
  a wafer stage mover for moving the wafer stage and the wafer along a scan axis, wherein the wafer stage mover also moves the wafer stage and wafer about a tilting axis to a plurality of alternative adjustment angles, the tilting axis being orthogonal to the scan axis, wherein a separate, first OPE curve is estimated at each of the plurality of alternative adjustment angles using lithographic modeling and without test exposures of the wafer; and
  an OPE adjuster that controls the wafer stage mover to move the wafer stage and the wafer about the tilting axis to the adjustment angle having the first OPE curve determined without test exposures of the wafer that approximately matches the second OPE curve estimated without test exposures of a wafer.

18. The first exposure apparatus of claim 17 further comprising a projection optical assembly having an adjustable numerical aperture, and wherein the OPE adjuster controls numerical aperture to adjust the first OPE curve.

19. The first exposure apparatus of claim 17 further comprising an illumination system having a sigma, and wherein the OPE adjuster controls the sigma to adjust the first OPE curve.

20. The first exposure apparatus of claim 17 further comprising an illumination system having a wavelength spectrum, and wherein the OPE adjuster controls the wavelength spectrum to adjust the first OPE curve.

* * * * *

UNITED STATES PATENT AND TRADEMARK OFFICE
CERTIFICATE OF CORRECTION

| | |
|---|---|
| PATENT NO. | : 8,300,214 B2 |
| APPLICATION NO. | : 12/342987 |
| DATED | : October 30, 2012 |
| INVENTOR(S) | : Stephen P. Renwick and Steven Douglas Slonaker |

It is certified that error appears in the above-identified patent and that said Letters Patent is hereby corrected as shown below:

Column 12, line 29, delete "the" and substitute -- a --.

Column 12, line 32, delete "the" and substitute -- a --.

Column 12, line 35, delete "the" and substitute -- a --.

Column 12, line 37, delete "the" and substitute -- a --.

Column 13, line 26, delete "the" and substitute -- a --.

Column 13, line 30, delete "the" and substitute -- a --.

Column 13, line 33, delete "the" and substitute -- a --.

Column 13, line 35, delete "the" and substitute -- a --.

Column 14, line 28, delete "the" and substitute -- a --.

Column 14, line 32, delete "the" and substitute -- a --.

Signed and Sealed this
Fifteenth Day of January, 2013

David J. Kappos
*Director of the United States Patent and Trademark Office*